(12) United States Patent
Kwon et al.

(10) Patent No.: US 8,300,116 B2
(45) Date of Patent: Oct. 30, 2012

(54) TWO-PATH SIGMA-DELTA ANALOG-TO-DIGITAL CONVERTER AND IMAGE SENSOR INCLUDING THE SAME

(75) Inventors: Min Ho Kwon, Seoul (KR); Seog Heon Ham, Suwon-si (KR); Dong Hun Lee, Yongin-si (KR); Kwi Sung Yoo, Seoul (KR); Wun-Ki Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 444 days.

(21) Appl. No.: 12/656,577

(22) Filed: Feb. 4, 2010

(65) Prior Publication Data
US 2010/0208114 A1      Aug. 19, 2010

(30) Foreign Application Priority Data
Feb. 13, 2009    (KR) .................. 10-2009-0012055

(51) Int. Cl.
  *H04N 5/228*    (2006.01)
  *H04N 5/335*    (2006.01)
  *H03M 1/12*    (2006.01)
(52) U.S. Cl. ................ 348/222.1; 348/294; 341/155
(58) Field of Classification Search ........... 348/222.1, 348/294, 308; 341/126, 143, 155
See application file for complete search history.

(56) References Cited

U.S. PATENT DOCUMENTS

| | | | | |
|---|---|---|---|---|
| 6,021,172 A * | 2/2000 | Fossum et al. | ................. | 341/158 |
| 7,002,628 B1 * | 2/2006 | Panicacci | ................... | 341/155 |
| 7,283,080 B2 * | 10/2007 | Kirsch | .................... | 341/155 |
| 7,570,293 B2 * | 8/2009 | Nakamura | .................... | 348/308 |
| 7,768,562 B2 * | 8/2010 | Boemler | ........................ | 348/302 |
| 7,773,018 B2 * | 8/2010 | Chae et al. | ................... | 341/143 |
| 2004/0100461 A1 * | 5/2004 | Fortier | ....................... | 345/204 |
| 2007/0236375 A1 | 10/2007 | Andre | | |
| 2008/0084341 A1 * | 4/2008 | Boemler | ...................... | 341/143 |
| 2009/0051801 A1 * | 2/2009 | Mishina et al. | .............. | 348/311 |

FOREIGN PATENT DOCUMENTS

| | | |
|---|---|---|
| JP | 07-249989 | 9/1995 |
| JP | 11-055121 | 2/1999 |
| KR | 10-2008-0052270 | 6/2008 |

* cited by examiner

*Primary Examiner* — Nhan T Tran
(74) *Attorney, Agent, or Firm* — Harness, Dickey & Pierce, P.L.C.

(57) ABSTRACT

A two-path sigma-delta analog-to-digital converter and an image sensor including the same are provided. The two-path sigma-delta analog-to-digital converter includes at least one integrator configured to integrate a first integrator input signal during a second half cycle of a clock signal and integrate a second integrator input signal during a first half cycle of the clock signal by using a single operational amplifier; a quantizer configured to quantize integrated signals from the at least one integrator and output a first digital signal and a second digital signal; and a feedback loop configured to feed back the first and second digital signals to an input of the at least one integrator. A first analog signal and a second analog signal respectively input from two input paths are respectively converted to the first and second digital signals using the single operational amplifier, thereby increasing power efficiency and reducing an area.

10 Claims, 14 Drawing Sheets

FIG. 10A (COMPARATIVE)
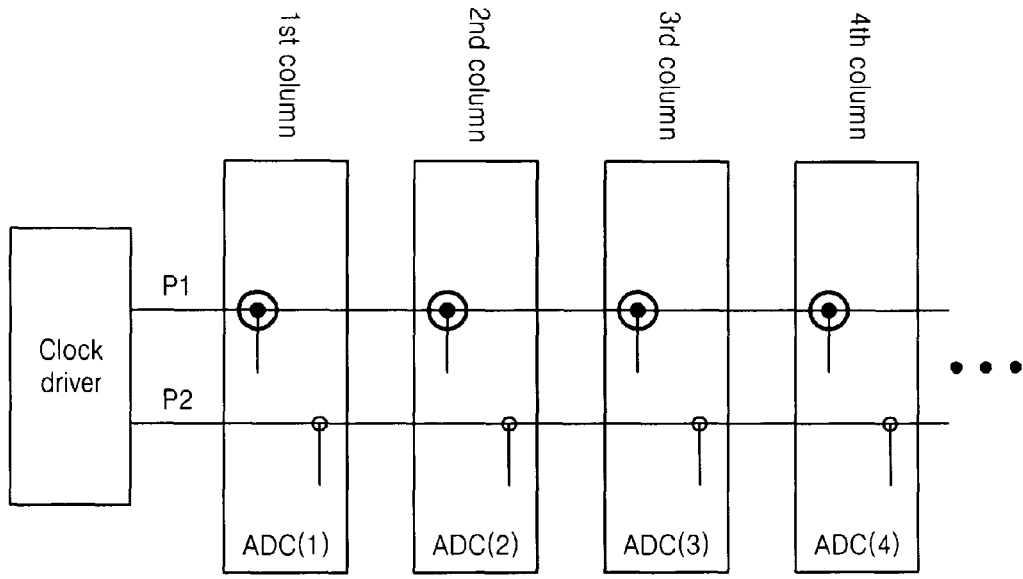
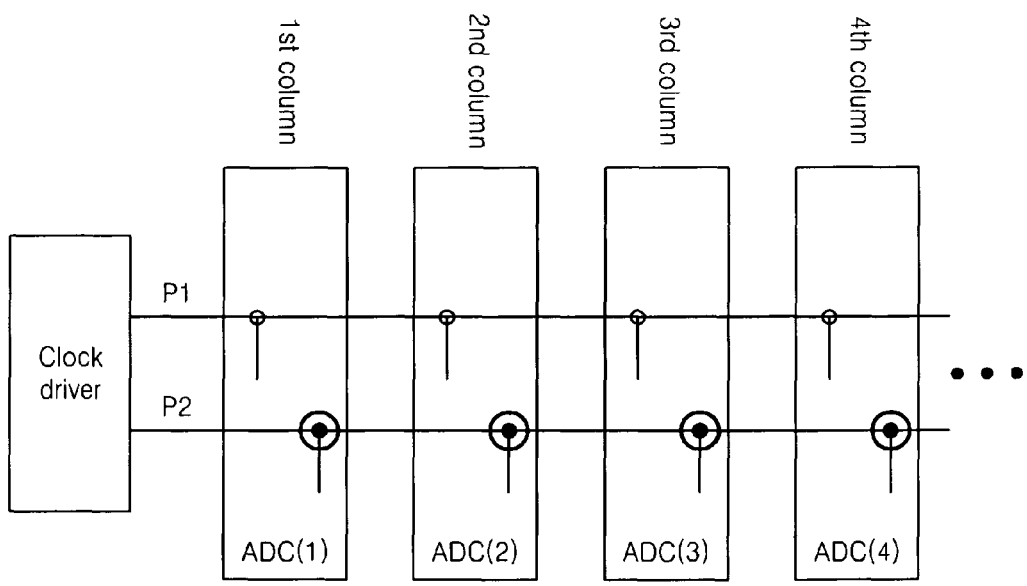

TWO-PATH SIGMA-DELTA ANALOG-TO-DIGITAL CONVERTER AND IMAGE SENSOR INCLUDING THE SAME

CROSS-REFERENCE TO RELATED APPLICATIONS

This application claims the benefit of Korean Patent Application No. 10-2009-0012055 filed on Feb. 13, 2009, in the Korean Intellectual Property Office (KIPO), the entire contents of which are incorporated herein by reference.

BACKGROUND

1. Field

The present invention relates to an analog-to-digital converter (ADC), and more particularly, to a sigma-delta ADC.

2. Related Art

An ADC is a device or a circuit which converts an analog signal into a digital signal and is usually used in CMOS image sensors. A CMOS image sensor is usually used in portable devices such as mobile phones and digital cameras and converts an optical signal into an electrical signal. The conversion occurs at a pixel of the CMOS image sensor including a photodiode and a readout circuit.

In an image sensor, a pixel array includes a plurality of pixels arranged in a two-dimensional matrix and each pixel outputs an image signal from light energy. The pixel integrates a photo-charge corresponding to the amount of light input through a photodiode and outputs a pixel signal in a form of analog current based on the integrated charges. The pixel signal is transmitted to a readout circuit. The readout circuit converts the analog signal into a digital signal.

A single ADC circuit is provided for each of the columns of the pixel array to convert an analog signal output from the pixel array into a digital signal in the image sensor. Accordingly, as many ADC circuits as the number of columns of the pixel array are needed, which is a big burden in terms of power consumption and area.

SUMMARY

Some embodiments of the present invention provide a sigma-delta analog-to-digital converter (ADC) for reducing power consumption and an area and an image sensor including the same.

According to some embodiments of the present invention, there is provided a two-path sigma-delta ADC including at least one integrator configured to integrate a first integrator input signal during a second half cycle of a clock signal and integrate a second integrator input signal during a first half cycle of the clock signal by using a single operational amplifier, a quantizer configured to quantize integrated signals from the at least one integrator and output a first digital signal and a second digital signal, and a feedback loop configured to feed back the first and second digital signals to an input of the at least one integrator. The first and second integrator input signals respectively correspond to a first analog signal and a second analog signal respectively input from two input paths.

The two-path sigma-delta ADC may further include a first sampling circuit configured to sample and store the first analog signal during the first half cycle of the clock signal and a second sampling circuit configured to sample and store the second analog signal during the second half cycle of the clock signal. The first analog signal sampled and stored in the first sampling circuit may be transmitted to the input of the at least one integrator while the second analog signal is being sampled and the second analog signal sampled and stored in the second sampling circuit may be transmitted to the input of the at least one integrator while the first analog signal is being sampled.

According to other embodiments of the present invention, there is provided an image sensor including a pixel array including a plurality of pixels each of which is connected to a corresponding column line among a plurality of column lines and a corresponding row line among a plurality of row lines and converts an optical signal into an electrical pixel signal; and a two-path sigma-delta ADC connected to two corresponding column lines among the plurality of column lines and alternately converting a first analog input signal and a second analog input signal, which are based on pixel signals of the two corresponding column lines, respectively, into a first digital signal and a second digital signal, respectively, during a first half cycle and a second half cycle, respectively, of a clock signal.

The two-path sigma-delta ADC may sample and store the first analog input signal in a first sampling capacitor and simultaneously convert the second analog input signal that has already been sampled and stored in a second sampling capacitor into the second digital signal during the first half cycle of the clock signal, and the two-path sigma-delta ADC may sample and store the second analog input signal in the second sampling capacitor and simultaneously convert the first analog input signal that has already been sampled and stored in the first sampling capacitor into the first digital signal during the second half cycle of the clock signal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIGS. 10A and 10B are diagrams provided to compare the load of a clock driver in a comparative example with that in some embodiments of the present invention.

DETAILED DESCRIPTION OF THE EMBODIMENTS

Figure 1:
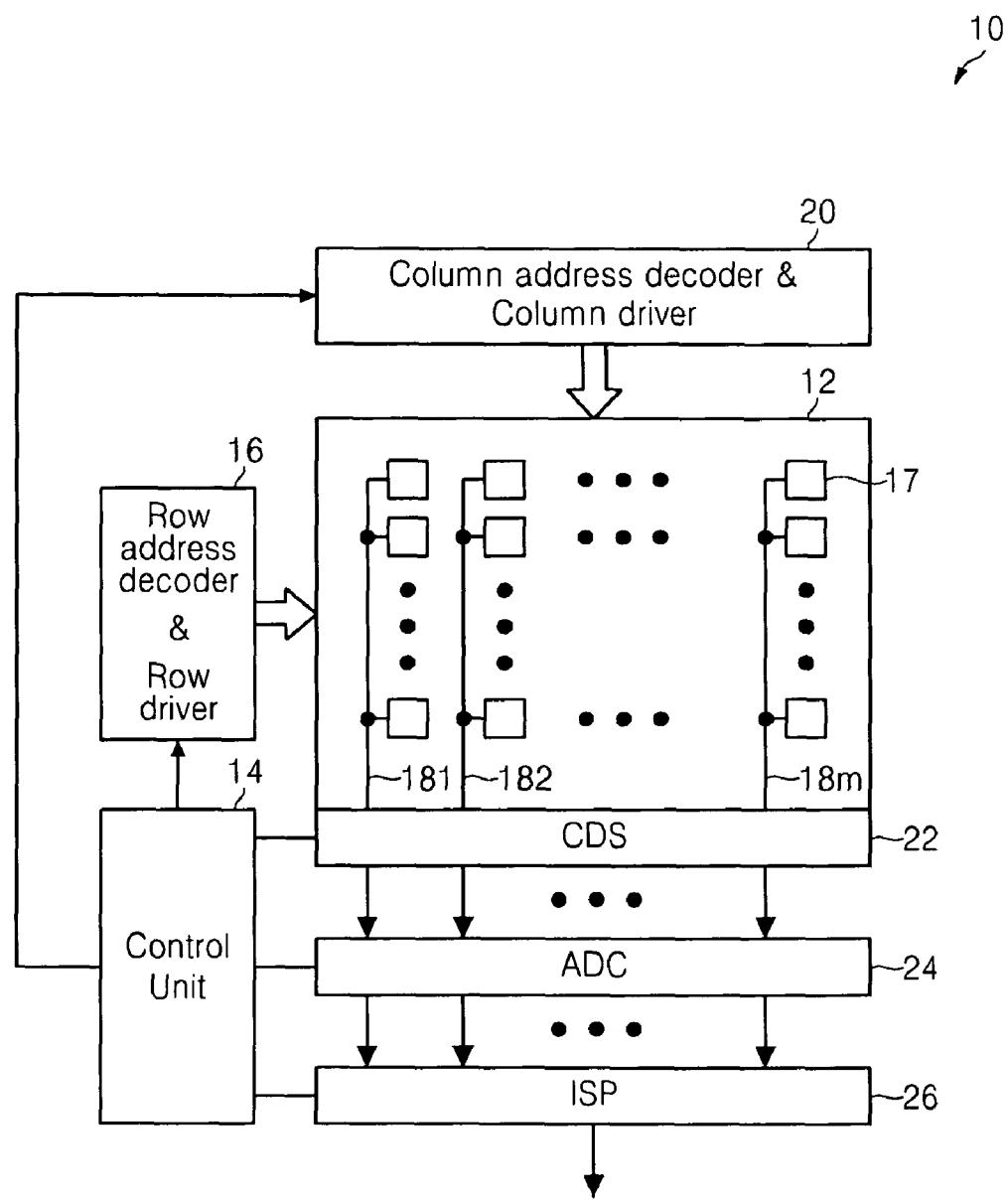
FIG. 1 is a functional block diagram of an image sensor according to some embodiments of the present invention.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
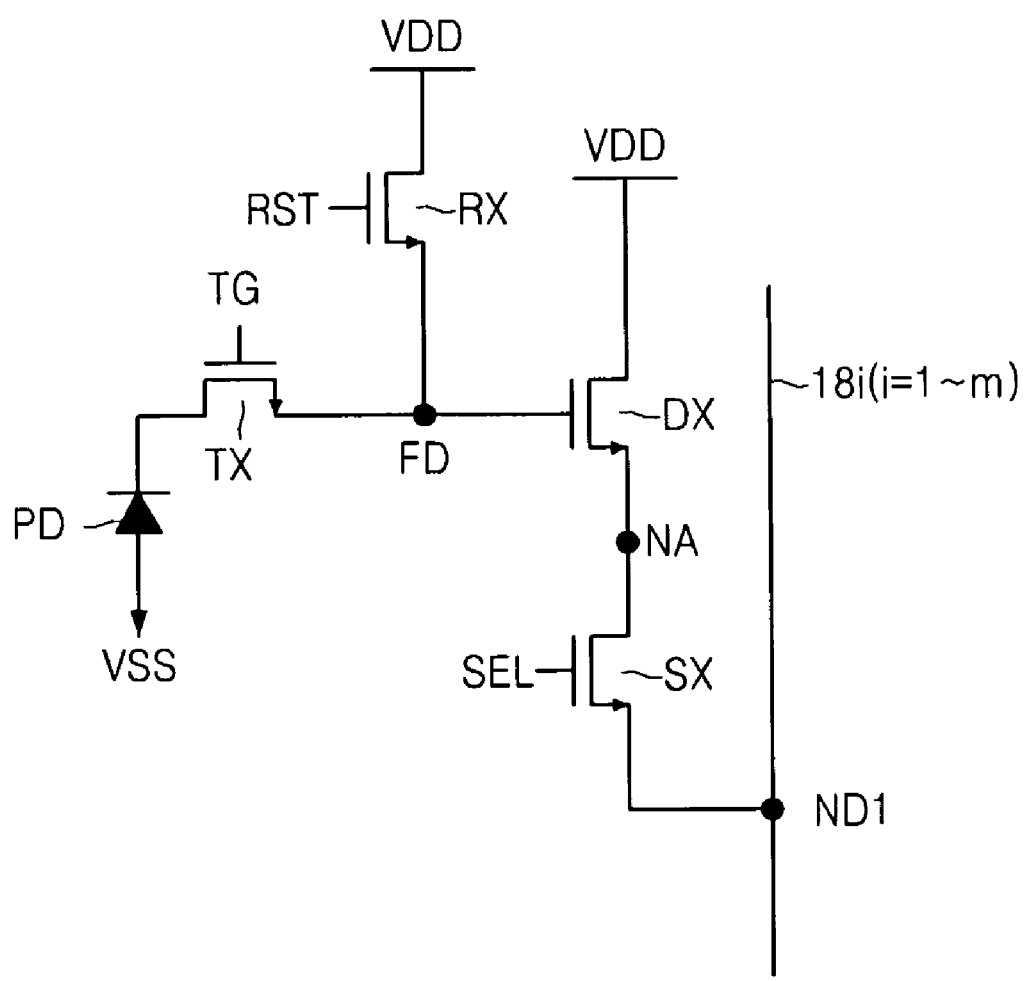
FIG. 2 is a circuit diagram of a unit pixel of a pixel array illustrated in FIG. 1.

FIG. 1 is a functional block diagram of an image sensor 10 according to some embodiments of the present invention. FIG. 2 is a circuit diagram of a unit pixel 17 of a pixel array 12 illustrated in FIG. 1. Referring to FIGS. 1 and 2, the image sensor 10 includes the pixel array 12, a control unit 14, a row address decoder & row driver 16, a column address decoder & column driver 20, a Correlated Double Sampling (CDS) block 22, an analog-to-digital converter (ADC) block 24, and an image signal processor (ISP) 26.

The pixel array 12 may include a plurality of unit pixels 17 arranged in a two-dimensional matrix type. The plurality of unit pixels 17 are connected to a plurality of row lines (not shown), respectively. The plurality of unit pixels 17 are also connected to a plurality of column lines 181-18m, respectively. Each of the plurality of unit pixels 17 may include a red pixel, a green pixel and/or a blue pixel. The red pixel converts red spectrum light into an electrical signal. The green pixel converts green spectrum light into an electrical signal. The blue pixel converts blue spectrum light into an electrical signal. In addition, as illustrated in FIG. 1, a color filter for transmitting particular spectrum light is provided above each of the plurality of unit pixels 17 included in the pixel array 12.

As illustrated in FIG. 2, each of the unit pixels 17 may include a photodiode PD, a transmission transistor TX, a floating diffusion node FD, a reset transistor RX, a drive transistor (or source follow transistor) DX, and a selection transistor SX, as illustrated in FIG. 2. The photodiode is connected to a voltage source VSS. The photodiode PD receives light energy from a light emitting source and generates and integrates a photo-charge. The transmission transistor TX transmits the photo-charge or photocurrent integrated by the photodiode PD to the floating diffusion node FD in response to a transmission control signal TG input to the gate of the transmission transistor TX.

The floating diffusion node FD is formed by a floating diffusion region and stores the photo-charge received from the photodiode PD through the transmission transistor TX. The reset transistor RX is connected between a power supply voltage VDD and the floating diffusion node FD and resets the floating diffusion node FD to the power supply voltage VDD in response to a reset signal RST. The drive transistor DX is connected between the power supply voltage VDD and a first node NA and causes a voltage at the first node NA to source follow the power supply voltage VDD based on the charge stored in the floating diffusion node FD. The selection transistor SX is connected between the first node NA and an output node ND1 and forms an electrical path between the first node NA and the output node ND1 in response to a selection signal SEL.

Each of the unit pixels 17 outputs pixel signals (e.g., a reset signal and an image signal) in units of column lines 181 through 18m in response to a control signal generated by the row address decoder & row driver 16. In other words, pixel signals of a selected row line are transmitted to the CDS block 22 through the column lines 181 through 18m. FIG. 2 exemplary shows a four-transistor (4-TR) pixel including the four transistors TX, RX, DX, and SX, however, according to some example embodiments, the structure of the pixel 17 may be different.

The CDS block 22 performs CDS on a reset signal and an image signal output from the pixel array 12 and outputs a CDS result to the ADC block 24. The CDS block 22 may sample the reset signal and the image signal and output the voltage difference between the sampled reset signal and the sampled image signal. CDS is performed to remove the noise of a pixel and may not be performed in other embodiments of the present invention.

The ADC block 24 converts the CDS signal output from the CDS block 22 into a digital signal and outputs the converted CDS signal. When the CDS block 22 is provided, the ADC block 24 converts the pixel signals (e.g., a reset signal and an image signal) output from the pixel array 12 into digital signals and outputs the converted pixel signals.

The ISP 26 performs digital image processing based on the digital signals output from the ADC block 24. A digital image processed signal generated by the ISP 26 may be serialized when the digital image processed signal is output.

Figure 3:
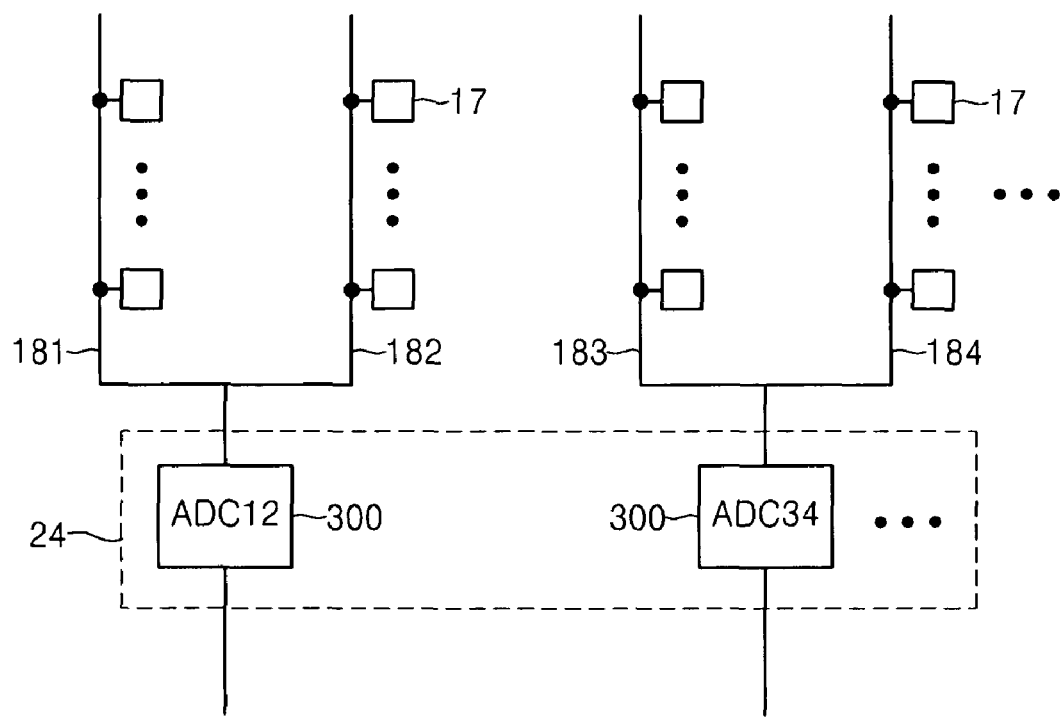
FIG. 3 is a block diagram showing the connection of a sigma-delta analog-to-digital converter (ADC) according to some embodiments of the present invention.

FIG. 3 is a block diagram showing the connection of each of a plurality of ADCs 300 included in the ADC block 24 according to some embodiments of the present invention. Referring to FIG. 3, each of the ADCs 300 is provided for two column lines 181 and 182 or 183 and 184. Since the structure and the operations of the ADC12 for the first and second column lines 181 and 182 are the same as those of the ADC34 for the third and fourth column lines 181 and 182, only the ADC12 will be described.

The ADC12 converts analog input signals received from the two column lines 181 and 182 into digital signals. The analog input signals may be pixel signals output from the pixel array 12 or CDS signals output from the CDS block 22. The ADC12 samples an analog input signal from the first column line 181 and simultaneously converts an analog input signal from the second column line 182 into a digital signal during a first half of a clock cycle, Φ1, (referred to as "first half cycle Φ1") of a clock signal (CLK in FIG. 6) and samples an analog input signal from the second column line 182 and simultaneously converts an analog input signal from the first column line 181 into a digital signal during a second half of the clock cycle, Φ2, (referred to as "second half cycle Φ2"). Accordingly, analog input signals corresponding to two column lines can be converted into digital signals during a single clock cycle. The structure and the operations of the ADC12 will be described in detail later.

Figure 4:
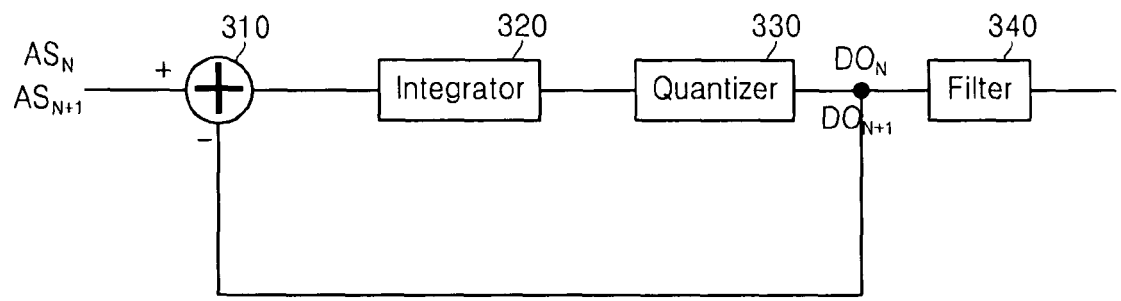
FIG. 4 is a schematic functional block diagram of an ADC according to some embodiments of the present invention.

FIG. 4 is a schematic functional block diagram of an ADC 300' according to some embodiments of the present invention. Referring to FIG. 4, the ADC 300' includes an adder 310, an integrator 320, and a quantizer 330. The ADC 300' may also include a digital filter 340 which filters an output signal of the quantizer 330. FIG. 4 illustrates signals $AS_N$, $AS_{N+1}$, $DO_N$ and $DO_{N+1}$ which will be discussed in greater detail below with reference to FIG. 5.

The adder 310 adds a feedback signal (i.e., an output signal of the quantizer 330) to an analog input signal. Although not shown, a circuit corresponding to a digital-to-analog converter (DAC) may be provided in a feedback path. Here, the adder 310 performs subtraction as well as addition. The integrator 320 integrates an output signal of the adder 310. The quantizer 330 quantizes an integrated signal and converts it into a digital signal.

Figure 5:
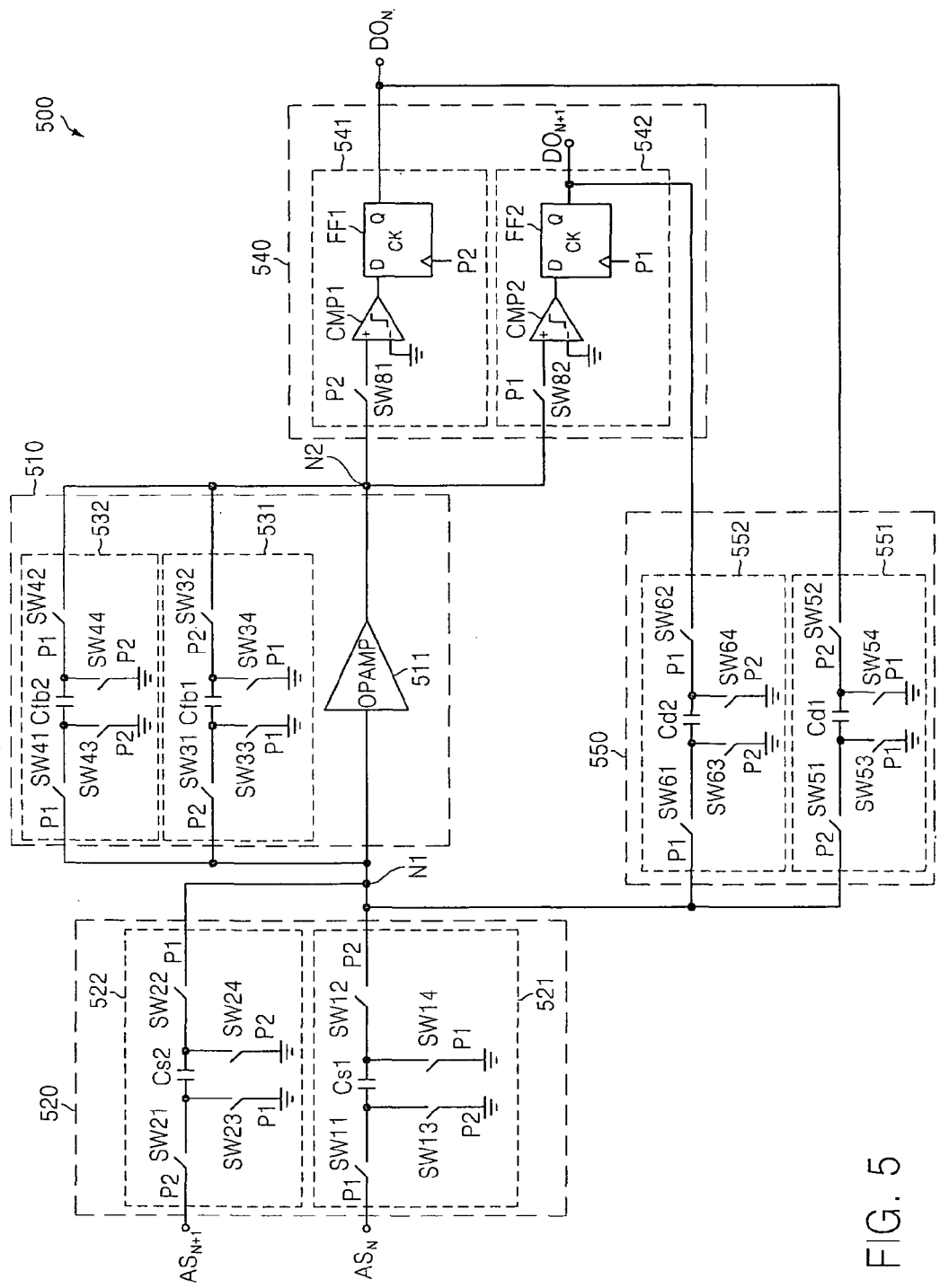
FIG. 5 is a circuit diagram of an ADC illustrated in FIG. 3.
Figure 6:
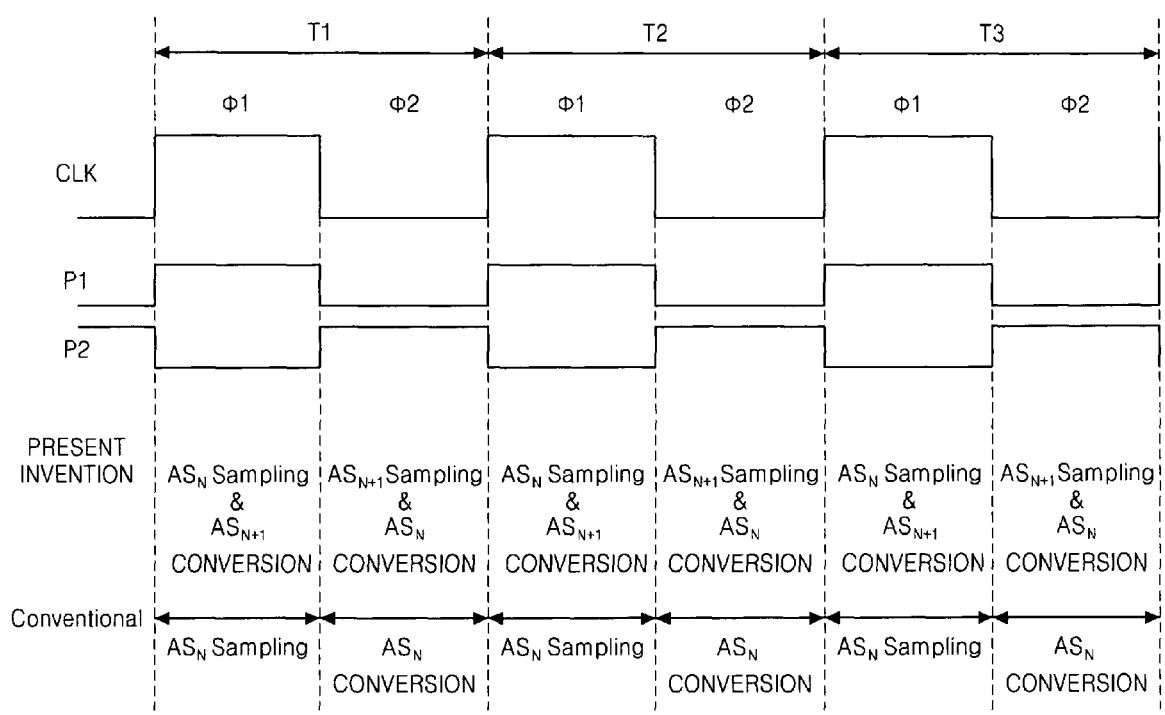
FIG. 6 is a schematic timing chart of the operation of the ADC illustrated in FIG. 5.

FIG. 5 is a circuit diagram of an example 500 of the ADC 300' illustrated in FIG. 3. FIG. 6 is a schematic timing chart of the operation of the ADC 500 illustrated in FIG. 5. Referring to FIGS. 5 and 6, an ADC 500 includes a sampling unit 520, an integrator 510, a quantizer 540, and a feedback loop 550.

The sampling unit 520 includes a first sampling circuit 521 which samples and stores a first analog input signal $AS_N$ during the first half cycle Φ1 of the clock signal CLK and a second sampling circuit 522 which samples and stores a second analog input signal $AS_{N+1}$ during the second half cycle Φ2 of the clock signal CLK. The first and second analog input signals $AS_N$ and $AS_{N+1}$ may be signals respectively corresponding to an N-th column line and an (N+1)-th column line in the image sensor 10.

The integrator 510 includes an operational amplifier 511, a first switched feedback capacitor 531, and a second switched feedback capacitor 532. The operational amplifier 511 is used in common for the first and second switched feedback capacitors 531 and 532. The integrator 510 integrates a first integrator input signal during the first half cycle Φ1 of the clock signal CLK and integrates a second integrator input signal during the second half cycle Φ2 of the clock signal CLK.

The quantizer 540 includes a first quantizer 541 and a second quantizer 542. The feedback loop 550 includes a first feedback loop 551 which feeds back an output signal of the first quantizer 541 to a first node N1 and a second feedback loop 552 which feeds back an output signal of the second quantizer 542 to the first node N1.

The first sampling circuit 521 samples the first analog input signal $AS_N$ to a sampling capacitor Cs1 in response to a first phase signal P1 and provides a sampled signal to an input terminal of the operational amplifier 511 in response to a second phase signal P2. The first and second phase signals P1 and P2 have opposite polarities. For instance, the first phase signal P1 may be an in-phase signal having the same cycle and phase as the clock signal CLK or a signal a predetermined period of time delayed than the clock signal CLK and the second phase signal P2 may be a signal which has the same cycle as the clock signal CLK and has a phase offset by 180-degrees with respect to the first phase signal P1. The first sampling circuit 521 includes first through fourth sampling switches SW11-SW14 and the sampling capacitor Cs1. The first and fourth sampling switches, SW11 and SW14, turn on in response to the first phase signal P1, so that the first analog input signal $AS_N$ is stored at the sampling capacitor Cs1. Thereafter, the second and third switches, SW12 and SW13, turn on in response to the second phase signal P2, so that the sampled first analog input signal $AS_N$ is provided to the input terminal of the operational amplifier 511.

The second sampling circuit 522 has the same structure as the first sampling circuit 521. The second sampling circuit 522 includes first through fourth switches SW21-SW24 and a sampling capacitor Cs2 which may operate in the same manner described above with respect to first through fourth switches SW1-SW14 and sapling capacitor Cs1 but with opposite operating phases. Accordingly, the second sampling circuit 522 stores the second analog input signal $AS_{N+1}$ at a sampling capacitor Cs2 in response to the second phase signal P2 and then provides the sampled second analog input signal $AS_{N+1}$ to the input terminal of the operational amplifier 511 in response to the first phase signal P1.

The integrator 510 may be divided into a first integrator which integrates a first integrator input signal during the first half cycle Φ1 of the clock signal CLK and a second integrator which integrates a second integrator input signal during the second half cycle Φ2 of the clock signal CLK. The first integrator includes the operational amplifier 511 and the first switched feedback capacitor 531 and the second integrator includes the operational amplifier 511 and the second switched feedback capacitor 532.

The first switched feedback capacitor 531 may include switches SW33 and SW34, each of which is disposed between one of both ends of a capacitor Cfb1 and a ground and operates in response to the first phase signal P1, and switches SW31 and SW32 which are respectively disposed between one end of the capacitor Cfb1 and the first node N1 and between the other end of the capacitor Cfb1 and the second node N2 and operate in response to the second phase signal P2.

The second switched feedback capacitor 532 includes switches SW41-SW44 and a capacitor Cfb2 which may operate in the same manner described above with respect to the switches SW31-SW34 and capacitor Cfb1 but with opposite operating phases. In other words, the second switched feedback capacitor 532 is configured to operate complementarily to the first switched feedback capacitor 531 in terms of phase, i.e., with a 180-degree phase difference.

The first quantizer 541 includes a quantization switch SW81, a comparator CMP1, and a flip-flop FF1. The first quantizer 541 compares an output signal of the operational amplifier 511 with a predetermined reference signal (e.g., a ground signal) in response to the second phase signal P2, outputs a 1-bit signal as a comparison result, and latches the 1-bit signal using the flip-flop FF1. The second quantizer 542 includes a quantization switch SW82, a comparator CMP2 and a flip-flop FF2 which may operate in the same manner described above with reference to the comparator CMP1 and the flip-flop FF1, but with opposite operating phases.

The first feedback loop 551 may have a similar structure to that of the first switched feedback capacitor 531. For instance, the first feedback loop 551 may include switches SW53 and SW54, each of which is disposed between one of both ends of a capacitor Cd1 and a ground and operates in response to the first phase signal P1, and switches SW51 and SW52 which are respectively disposed between one end of the capacitor Cd1 and the first node N1 and between the other end of the capacitor Cd1 and an output of the first quantizer 541 and operate in response to the second phase signal P2, thereby feeding back an output signal of the first quantizer 541 to the first node N1 in response to the second phase signal P2.

The second feedback loop 552 includes switches SW61-SW64 and a capacitor Cd2 which may operate in the same manner described above with respect to the switches SW51-SW54 and capacitor Cd1 but with opposite operating phases. In other words, the second feedback loop 552 is configured to operate complementarily to the first feedback loop 551 in terms of phase, i.e., with a 180-degree phase difference.

Figure 7A:
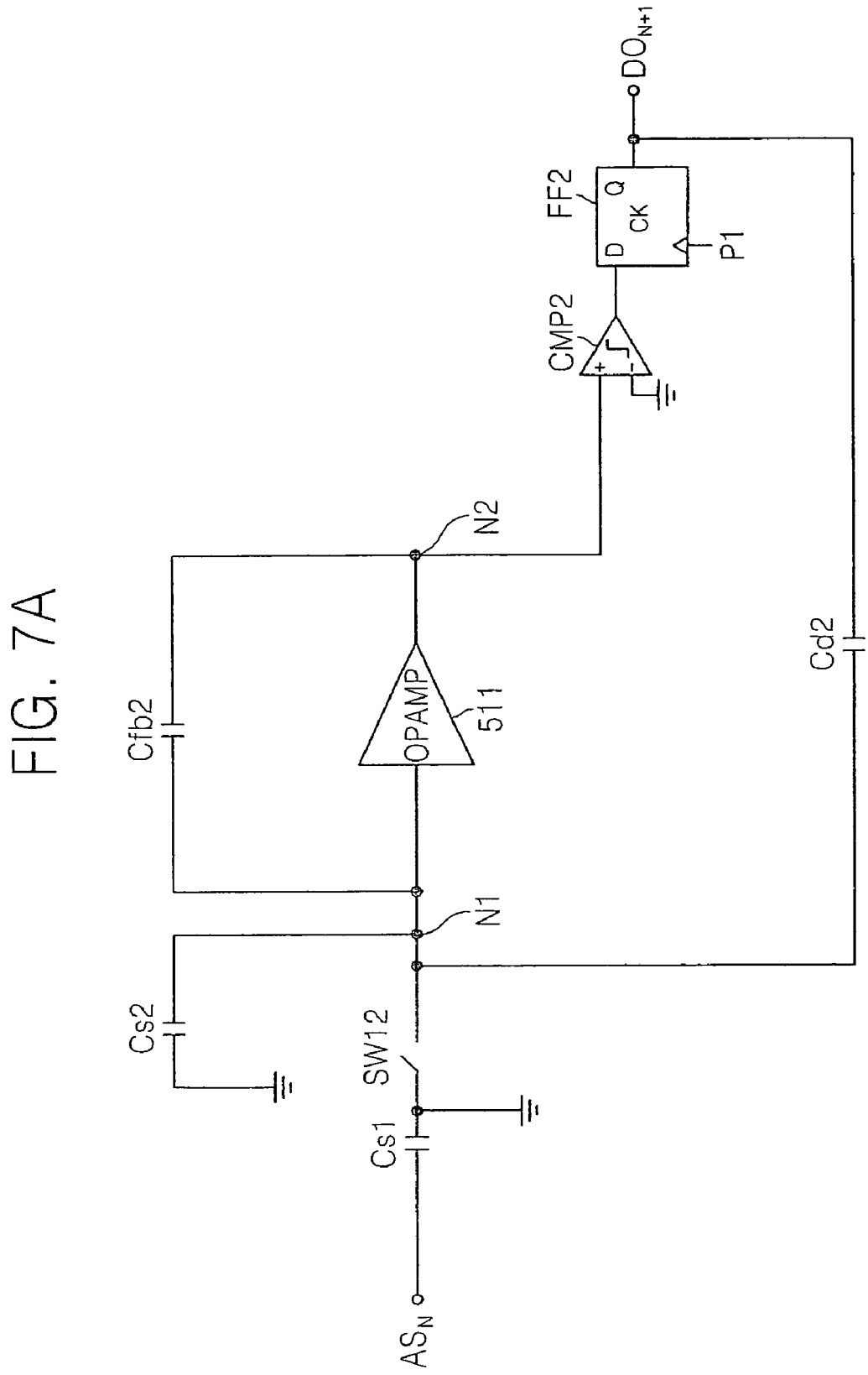
FIGS. 7A and 7B are diagrams for explaining the operation of the ADC illustrated in FIG. 5 during a first half cycle and the operation thereof during a second half cycle.
Figure 7B:
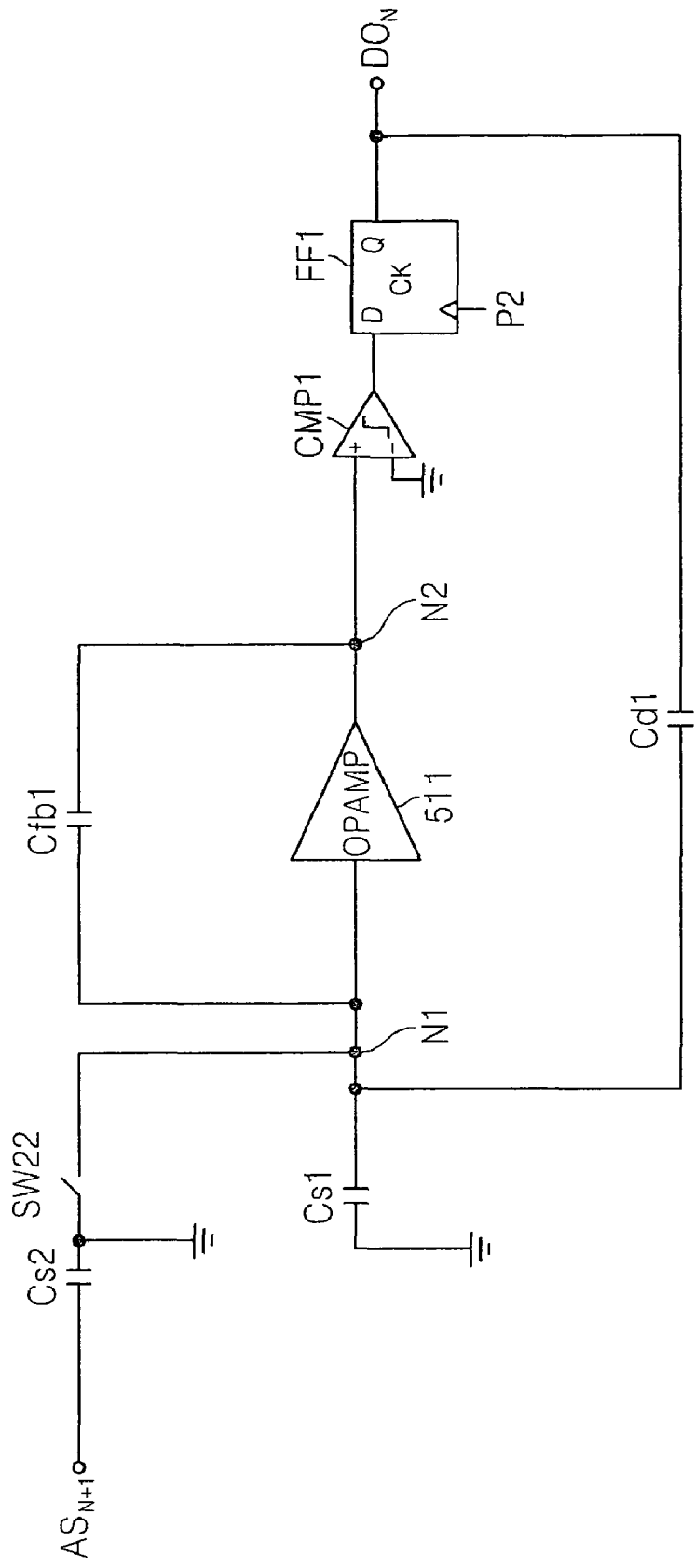

FIGS. 7A and 7B are diagrams for explaining the operation of the ADC 500 illustrated in FIG. 5 during the first half cycle Φ1 and the operation thereof during the second half cycle Φ2. The ADC 500 has a connection illustrated in FIG. 7A through switches SW11~SW64 during the first half cycle Φ1 and has a connection illustrated in FIG. 7B through switches SW11~SW64 during the second half cycle Φ2.

During the first half cycle Φ1, the first sampling circuit 521 stores the first analog input signal $AS_N$ at the sampling capacitor Cs1. During the second half cycle Φ2, the second sampling circuit 522 stores the second analog input signal $AS_{N+1}$ at the sampling capacitor Cs2.

The first analog input signal $AS_N$ stored at the sampling capacitor Cs1 during the first half cycle Φ1 is transmitted to a first switched feedback capacitor Cfb1 during the second half cycle Φ2. Therefore, during the second half cycle Φ2, the first analog input signal $AS_N$ is integrated and an integrated signal is transmitted to the first quantizer 541. The comparator CMP1 of the first quantizer 541 compares the integrated signal with a predetermined reference signal (e.g., a ground signal) and outputs a 1-bit signal as a comparison result. The 1-bit signal is latched by the flip-flop FF1 operating in response to the second phase signal P2 and then output as a first digital output signal $DO_N$. The first digital output signal $DO_N$ is fed back by the first feedback loop 551 to the first node N1 and added to the first analog input signal $AS_N$. The second switched feedback capacitor Cfb2 and the capacitor Cd2 of the second feedback loop 552, which are not used during the first half cycle Φ1, are reset.

The second analog input signal $AS_{N+1}$ stored at the sampling capacitor Cs2 during the second half cycle Φ2 is transmitted to the second switched feedback capacitor Cfb2 during the first half cycle Φ1 of a subsequent clock cycle. Therefore, during the first half cycle Φ1, the second analog input signal $AS_{N+1}$ is integrated and an integrated signal is transmitted to the second quantizer 542. A comparator CMP2 of the second quantizer 542 compares the integrated signal with a predetermined reference signal (e.g., a ground signal) and outputs a 1-bit signal as a comparison result. The 1-bit signal is latched by a flip-flop FF2 operating in response to the first phase signal P1 and then output as a second digital output signal $DO_{N+1}$. The second digital output signal $DO_{N+1}$ is fed back by the second feedback loop 552 to the first node N1 and added to the second analog input signal $AS_{N+1}$. The first switched feedback capacitor Cfb1 and the capacitor Cd1 of the first feedback loop 551, which are not used during the second half cycle Φ2, are reset.

As described above, the ADC 500 converts the first and second analog input signals $AS_N$ and $AS_{N+1}$ corresponding to two input paths (e.g., two column lines of an image sensor) into digital signals $DO_N$ and $DO_{N+1}$, respectively, using the single operational amplifier 511. The operational amplifier 511 is used in integrating the second analog input signal $AS_{N+1}$ during the first half cycle Φ1 of the clock signal CLK and is used in integrating the first analog input signal $AS_N$ during the second half cycle Φ2 of the clock signal CLK, thereby increasing efficiency. Accordingly, two operational amplifiers necessary for two signals are reduced into a single operational amplifier, so that power efficiency is increased and a necessary area is decreased.

The ADC 300' is an example of a first-order sigma-delta ADC including a single integrator. According to other embodiments of the present invention, the ADC 300' may be implemented by a second- or higher-order sigma-delta ADC including two or more integrators.

Figure 8A:
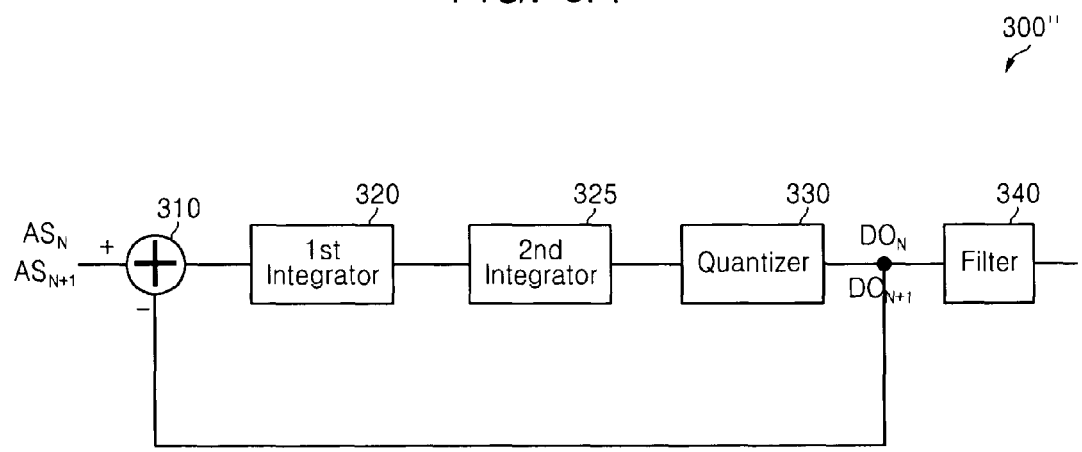
FIG. 8A is a schematic functional diagram of an ADC according to other embodiments of the present invention.

FIG. 8A is a schematic functional diagram of an ADC 300" according to other embodiments of the present invention. The ADC 300" includes the adder 310, the first-order integrator 320, a second-order integrator 325, and the quantizer 330. The ADC 300" may also include the digital filter 340 which filters an output signal of the quantizer 330. The ADC 300" illustrated in FIG. 8A has the same structure as the ADC 300' illustrated in FIG. 4, with the exception that the first-order integrator 320 and the second-order integrator 325 are connected in cascade in the ADC 300".

Figure 9:
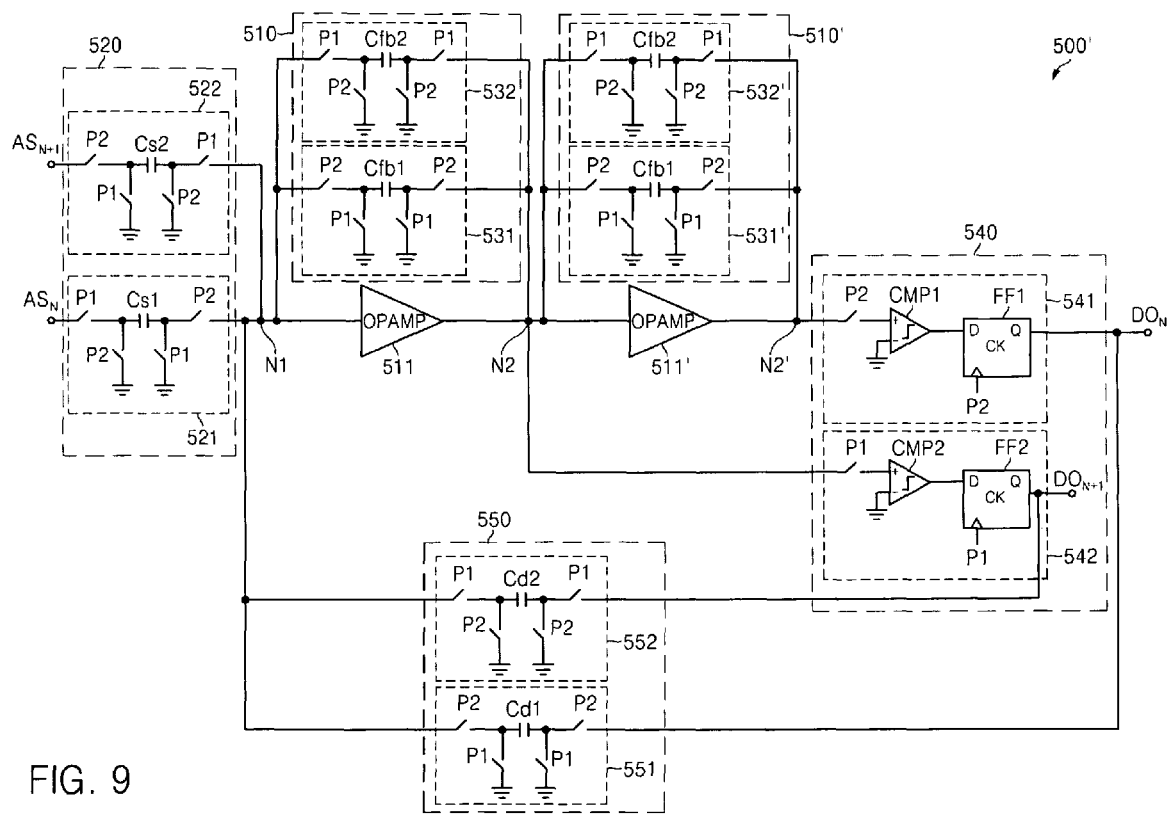
FIG. 9 is a circuit diagram of the ADC illustrated in FIG. 8A.

FIG. 9 is a circuit diagram of an example 500' of the ADC 300" illustrated in FIG. 8A. The ADC 500' illustrated in FIG. 9 has the same structure as the ADC 500 illustrated in FIG. 5, with the exception that the ADC 500' further includes a second order integrator 510'. The first-order integrator 510 and a second-order integrator 510' are connected in cascade in the ADC 500'. The structure and the operations of the first- and second-order integrators 510 and 510' are the same as those of the integrator 510 illustrated in FIG. 5. Thus, detailed descriptions thereof will be omitted.

Figure 8B:
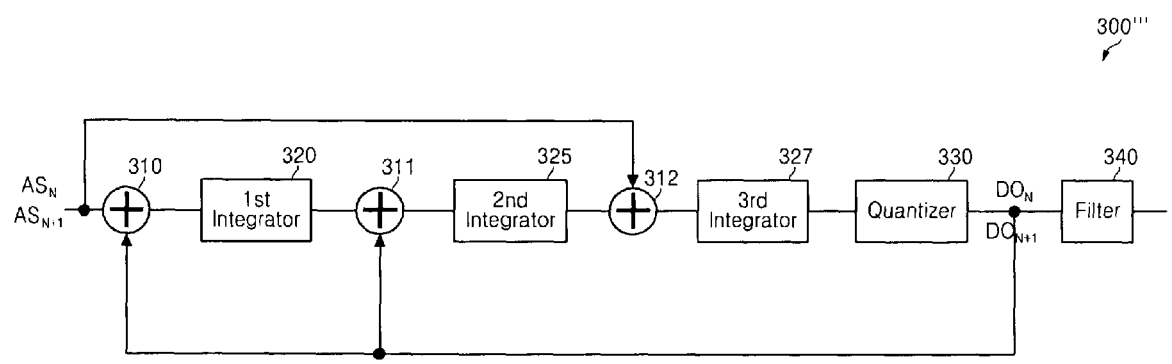
FIG. 8B is a schematic functional diagram of an ADC according to further embodiments of the present invention.

FIG. 8B is a schematic functional diagram of an ADC 300''' according to further embodiments of the present invention. The ADC 300''' includes first through third adders 310, 311, and 312, first- through third-order integrators 320, 325, and 327, and the quantizer 330. The ADC 300''' may also include the digital filter 340 which filters an output signal of the quantizer 330.

Each of the integrators 320, 325, and 327 uses a single operational amplifier like the integrator 320 illustrated in FIG. 5 and the integrator 510 shown in FIG. 9. Each of the integrators 320, 325, and 327 alternately integrates analog input signals respectively corresponding to two paths during the first half cycle Φ1 and the second half cycle Φ2, respectively, of the clock signal CLK. Accordingly, a single operational amplifier is shared with respect to the two paths instead of using two separate operational amplifiers for the two paths, respectively, thereby reducing an area and power consumption. In addition, the load of a clock driver driving the clock signal CLK input to an ADC is reduced by about half.

FIG. 10A is a diagram for explaining the load of a clock driver in the comparative example. In the comparative example, an image sensor includes a single ADC circuit ADC (1), ADC(2), ADC(3), or ADC(4) for each of first through fourth column lines of a pixel array and the clock driver must operate so that the first and second phase signals P1 and P2 are transmitted to each of the ADC circuits ADC(1) through ADC(4).

Figure 10B:
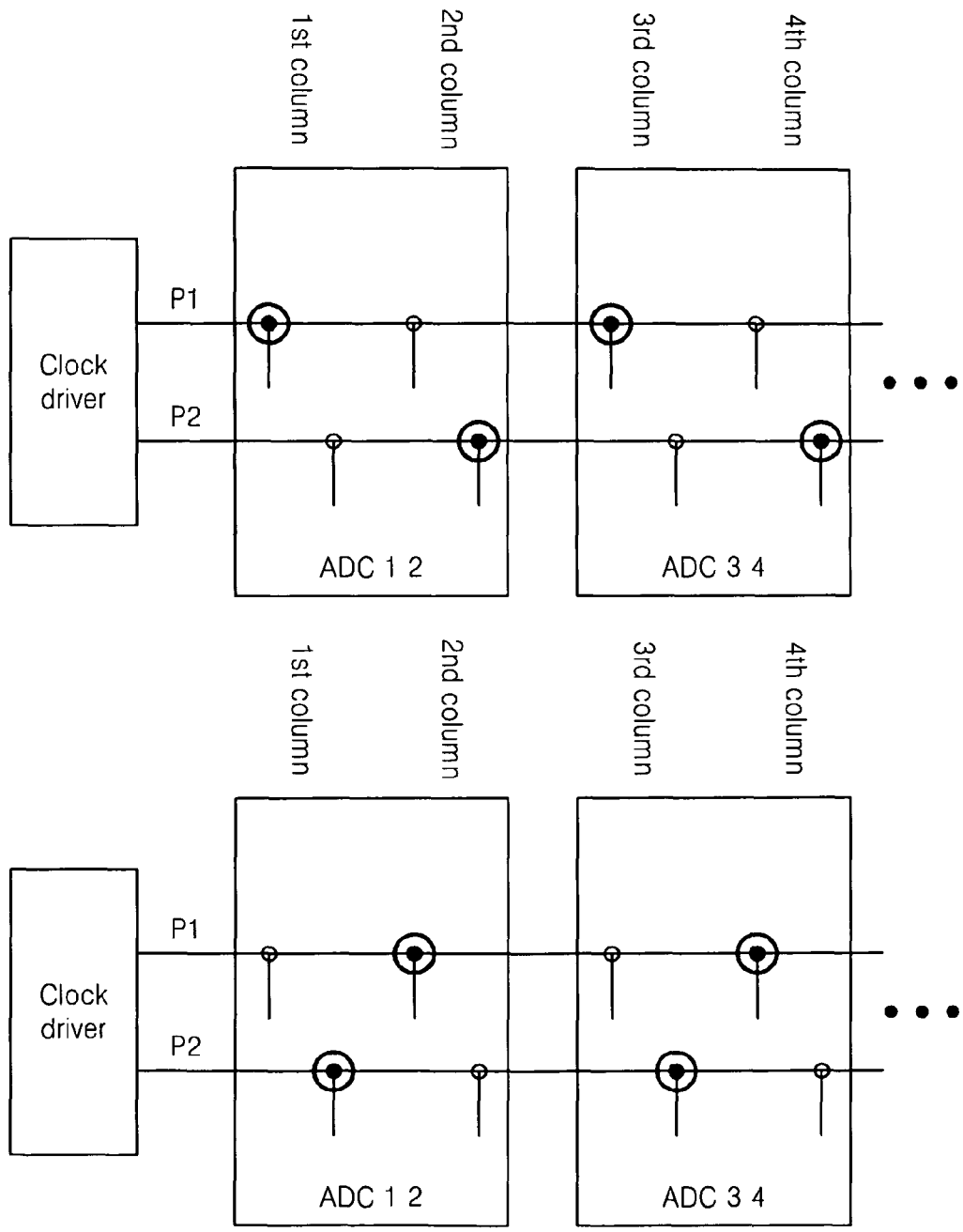

FIG. 10B is a diagram for explaining the load of a clock driver in some embodiments of the present invention. In the embodiments of the present invention, an image sensor includes a single ADC circuit ADC12 or ADC34 per two column lines of a pixel array and the ADC circuits ADC12 and ADC34 alternately perform conversion during a first half cycle and a second half cycle of a clock signal. Accordingly, the load of the clock driver in the embodiments of the present invention as illustrated in FIG. 10B is about half of the load of the clock driver in the comparative example as illustrated n FIG. 10A.

Figure 11:
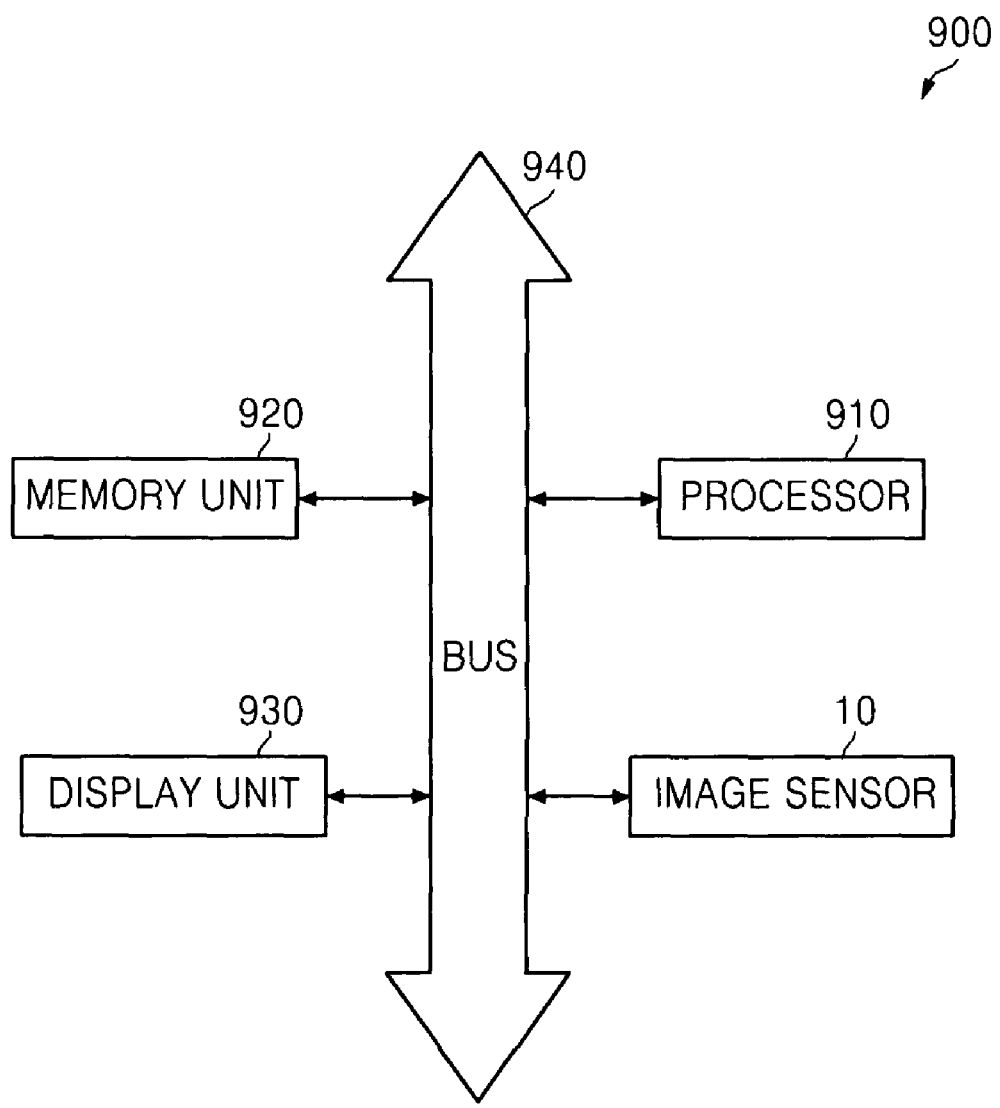
FIG. 11 is a schematic block diagram of an electronic device including an image sensor according to some embodiments of the present invention.

FIG. 11 is a schematic block diagram of an electronic device 900 including the image sensor 10 according to some embodiments of the present invention. The electronic device 900 may be a portable device including for example a mobile phone or a digital camera.

Referring to FIG. 11, the electronic device 900 includes the image sensor 10, a processor 910, a memory unit 920, a display unit 930, and a bus 940. The image sensor 10 is controlled by the processor 910 to convert an optical signal corresponding to external video information into a digital video signal and output the digital video signal. The processor 910 stores the digital video signal output from the image sensor 10 at the memory unit 920 through the bus 940. The processor 910 outputs video information stored at the memory unit 920 to the display unit 930.

In the above-described embodiments and drawings, the first phase signal P1 is exactly synchronized with the clock signal CLK and has an exact 180-degree phase difference from the second phase signal P2, but the phase difference may be reduced to facilitate actual manifestation. In addition, at least one signal based on the first phase signal P1 and at least one signal based on the second phase signal P2 may be used.

Example embodiments of the present invention can be embodied in hardware, software, firmware or combination thereof.

As described above, according to some embodiments of the present invention, two different inputs can be processed by an ADC using a single operational amplifier, so that two operational amplifiers can be reduced to one. As a result, the power efficiency of the ADC is increased and a necessary area of the ADC is reduced.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A two-path sigma-delta analog-to-digital converter comprising:
    at least one integrator configured to integrate a first integrator input signal during a second half cycle of a clock signal and integrate a second integrator input signal during a first half cycle of the clock signal by using a single operational amplifier, the first and second integrator input signals respectively corresponding to a first analog signal and a second analog signal respectively input from two input paths;
    a quantizer configured to quantize integrated signals from the at least one integrator and output a first digital signal and a second digital signal; and
    a feedback loop configured to feed back the first and second digital signals to an input of the at least one integrator.

2. The two-path sigma-delta analog-to-digital converter of claim 1, further comprising:
    a first sampling circuit configured to sample and store the first analog signal during the first half cycle of the clock signal; and
    a second sampling circuit configured to sample and store the second analog signal during the second half cycle of the clock signal,
    wherein the first sampling circuit is configured so that the first analog signal sampled and stored in the first sampling circuit is transmitted to the input of the at least one integrator while the second analog signal is being sampled, and the second sampling circuit is configured so that the second analog signal sampled and stored in the second sampling circuit is transmitted to the input of the at least one integrator while the first analog signal is being sampled.

3. The two-path sigma-delta analog-to-digital converter of claim 2,
    wherein the quantizer includes,
        a first quantizer configured to output the first digital signal, and
        a second quantizer configured to output the second digital signal, and
    the feedback loop includes,
        a first feedback loop configured to feed back an output signal of the first quantizer; and
        a second feedback loop configured to feed back an output signal of the second quantizer,
    wherein the first quantizer and the first feedback loop are configured to operate during the second half cycle of the clock signal and the second quantizer and the second feedback loop are configured to operate during the first half cycle of the clock signal.

4. The two-path sigma-delta analog-to-digital converter of claim 2, wherein the at least one integrator comprises:
    a first switched feedback capacitor configured to be selectively connected between an input terminal of the operational amplifier and an output terminal thereof in response to a first phase signal which is in phase with the clock signal; and
    a second switched feedback capacitor configured to be selectively connected between the input terminal of the operational amplifier and the output terminal thereof in response to a second phase signal having a 180-degree phase difference with respect to the first phase signal.

5. The two-path sigma-delta analog-to-digital converter of claim 4, wherein the second switched feedback capacitor is configured so that the second switched feedback capacitor is reset while the first switched feedback capacitor is being connected between the input and output terminals of the operational amplifier and the first switched feedback capacitor is configured so that the first switched feedback capacitor is reset while the second switched feedback capacitor is being connected between the input and output terminals of the operational amplifier.

6. The two-path sigma-delta analog-to-digital converter of claim 4,
wherein the first sampling circuit includes,
a first sampling capacitor, and
a plurality of first sampling switches configured to operate in response to the first phase signal to selectively store the first analog signal in the first sampling capacitor and to operate in response to the second phase signal to selectively transmit the first analog signal stored in the first sampling capacitor to the at least one integrator, and
wherein the second sampling circuit includes,
a second sampling capacitor, and
a plurality of second sampling switches configured to operate in response to the second phase signal to selectively store the second analog signal in the second sampling capacitor and to operate in response to the first phase signal to selectively transmit the second analog signal stored in the second sampling capacitor to the at least one integrator.

7. The two-path sigma-delta analog-to-digital converter of claim 1, wherein the quantizer comprises:
a comparator configured to compare an output signal of the integrator with a reference signal; and
a flip-flop configured to latch an output signal of the comparator.

8. An image sensor comprising:
a pixel array including a plurality of pixels each of which is connected to a corresponding column line among a plurality of column lines and a corresponding row line among a plurality of row lines, each of the plurality of pixels being configured to convert an optical signal into an electrical pixel signal; and
a two-path sigma-delta analog-to-digital converter (ADC) connected to two corresponding column lines among the plurality of column lines, the ADC being configured to alternately convert a first analog input signal into a first digital signal during a first half cycle of a clock signal and convert a second analog input signal into a second digital signal during a second half cycle of the clock signal, the first analog signal being based on pixel signals of a first corresponding column line, the second analog signal being based on pixel signals of a second corresponding column line.

9. The image sensor of claim 8, wherein the ADC is configured to sample and store the first analog input signal in a first sampling capacitor and simultaneously convert the second analog input signal that has already been sampled and stored in a second sampling capacitor into the second digital signal during the first half cycle of the clock signal, and the ADC is configured to sample and stores the second analog input signal in the second sampling capacitor and simultaneously convert the first analog input signal that has already been sampled and stored in the first sampling capacitor into the first digital signal during the second half cycle of the clock signal.

10. The image sensor of claim 8, wherein the ADC comprises:
a first integrator and a second integrator which share a single operational amplifier, the first integrator and second integrator being configured to integrate a first integrator input signal and a second integrator input signal, respectively, to generate a first integrator output signal and a second integrator output signal, respectively;
a first quantizer and a second quantizer configured to quantize the first integrator output signal from the first integrator and the second integrator output signal from the second integrator, respectively, and output a first digital signal and a second digital signal, respectively; and
a first feedback loop and a second feedback loop configured to feed back an output signal of the first quantizer and an output signal of the second quantizer, respectively, to be added to the first analog input signal and the second analog input signal, respectively,
wherein the first integrator, the first quantizer, and the first feedback loop are configured to operate during the second half cycle of the clock signal and the second integrator, the second quantizer, and the second feedback loop are configured to operate during the first half cycle of the clock signal.

* * * * *